United States Patent
Sartschev

(10) Patent No.: US 7,560,947 B2
(45) Date of Patent: Jul. 14, 2009

(54) PIN ELECTRONICS DRIVER

(75) Inventor: Ronald A. Sartschev, Dunstable, MA (US)

(73) Assignee: Teradyne, Inc., North Reading, MA (US)

( * ) Notice: Subject to any disclaimer, the term of this patent is extended or adjusted under 35 U.S.C. 154(b) by 114 days.

(21) Appl. No.: 11/237,384

(22) Filed: Sep. 28, 2005

(65) Prior Publication Data

US 2007/0069755 A1   Mar. 29, 2007

(51) Int. Cl.
*G01R 31/26*   (2006.01)
*G01R 31/28*   (2006.01)

(52) U.S. Cl. .................................. 324/765; 324/158.1
(58) Field of Classification Search ............... 324/763, 324/765, 158.1; 714/734, 743
See application file for complete search history.

(56) References Cited

U.S. PATENT DOCUMENTS

| | | | |
|---|---|---|---|
| 4,572,971 A * | 2/1986 | Necoechea | 327/108 |
| 5,101,153 A | 3/1992 | Morong, III | |
| 5,107,230 A * | 4/1992 | King | 326/86 |
| 5,176,525 A * | 1/1993 | Nierescher et al. | 439/68 |
| 5,184,029 A * | 2/1993 | King | 327/109 |
| 5,200,696 A | 4/1993 | Menis et al. | |
| 5,357,211 A | 10/1994 | Bryson et al. | |
| 5,493,519 A | 2/1996 | Allen, III | |
| 5,514,976 A | 5/1996 | Ohmura | |
| 5,521,493 A * | 5/1996 | Persons | 324/158.1 |
| 5,617,035 A | 4/1997 | Swapp | |
| 5,754,041 A | 5/1998 | Kaito et al. | |
| 5,757,677 A | 5/1998 | Lennen | |
| 6,073,259 A | 6/2000 | Sartschev et al. | |
| 6,275,544 B1 | 8/2001 | Aiello et al. | |
| 6,282,682 B1 | 8/2001 | Walker et al. | |
| 6,291,981 B1 | 9/2001 | Sartschev | |
| 6,374,379 B1 | 4/2002 | Walker et al. | |
| 6,492,797 B1 | 12/2002 | Maaasen et al. | |
| 6,498,473 B1 | 12/2002 | Yamabe | |
| 6,563,352 B1 | 5/2003 | Gohel et al. | |
| 6,566,890 B2 | 5/2003 | Hauptman | |
| 6,687,868 B1 | 2/2004 | Furukawa et al. | |

(Continued)

FOREIGN PATENT DOCUMENTS

WO   WO86/02167   4/1986

(Continued)

OTHER PUBLICATIONS

International Search Report for Application No. PCT/US2006/037413.

(Continued)

*Primary Examiner*—Ha Tran T Nguyen
*Assistant Examiner*—Roberto Velez
(74) *Attorney, Agent, or Firm*—Fish & Richardson P.C.

(57) ABSTRACT

Circuitry for driving a pin of a device includes a first circuit path terminating in a first impedance, a second circuit path terminating in a second impedance, where the second impedance is less than the first impedance, and a selection circuit to control operation of the second circuit path. When the second circuit path is not configured for operation, the first circuit path is configured to output one of plural first voltage signals. When the second circuit path is in configured for operation, the second circuit path is configured to output a second voltage signal. The second voltage signal is greater than the plural first voltage signals.

31 Claims, 3 Drawing Sheets

U.S. PATENT DOCUMENTS

| | | | |
|---|---|---|---|
| 6,771,061 B2 | 8/2004 | Sartschev et al. | |
| 6,828,775 B2 | 12/2004 | Chow et al. | |
| 6,836,136 B2 * | 12/2004 | Aghaeepour | 324/765 |
| 6,859,902 B1 | 2/2005 | Dalal et al. | |
| 6,868,047 B2 | 3/2005 | Sartschev et al. | |
| 6,879,175 B2 | 4/2005 | Conner | |
| 6,885,213 B2 | 4/2005 | Sunter | |
| 6,940,271 B2 | 9/2005 | West | |
| 7,023,366 B1 | 4/2006 | Walker et al. | |
| 7,102,375 B2 | 9/2006 | Walker et al. | |
| 7,109,736 B2 * | 9/2006 | Long | 324/765 |
| 7,120,840 B1 | 10/2006 | Shimanouchi | |
| 7,135,881 B2 | 11/2006 | Walker et al. | |
| 7,256,600 B2 | 8/2007 | Walker et al. | |
| 7,271,610 B2 | 9/2007 | Walker et al. | |
| 7,323,898 B2 | 1/2008 | Sartschev | |
| 7,403,030 B2 | 7/2008 | Walker et al. | |
| 2002/0121904 A1 | 9/2002 | Hauptman | |
| 2003/0107951 A1 | 6/2003 | Sartschev et al. | |
| 2003/0234645 A1 | 12/2003 | Iorga | |
| 2004/0051518 A1 | 3/2004 | Sartschev et al. | |
| 2004/0199842 A1 | 10/2004 | Sartschev | |
| 2005/0189950 A1 | 9/2005 | Lu | |
| 2006/0132163 A1 | 6/2006 | Walker et al. | |
| 2006/0132164 A1 | 6/2006 | Walker et al. | |
| 2006/0132165 A1 | 6/2006 | Walker et al. | |
| 2006/0132166 A1 | 6/2006 | Walker et al. | |
| 2006/0139048 A1 | 6/2006 | Walker et al. | |
| 2006/0161827 A1 * | 7/2006 | Gohel et al. | 714/736 |
| 2006/0279310 A1 | 12/2006 | Walker et al. | |
| 2007/0018681 A1 | 1/2007 | Sartschev | |
| 2007/0069755 A1 | 3/2007 | Sartschev et al. | |
| 2007/0071080 A1 | 3/2007 | Sartschev et al. | |
| 2007/0091991 A1 | 4/2007 | Sartschev et al. | |
| 2007/0126487 A1 | 6/2007 | Sartschev et al. | |
| 2008/0285636 A1 | 11/2008 | Sartschev et al. | |

FOREIGN PATENT DOCUMENTS

| | | |
|---|---|---|
| WO | WO 2006/071668 | 7/2006 |
| WO | WO2007/038480 | 4/2007 |

OTHER PUBLICATIONS

Written Opinion for Application No. PCT/US2006/037413.
Action and Response History in U.S. Appl. No. 11/023,023, downloaded from PAIR on Jul. 31, 2008.
Mercury, System on a Chip, 50 MHz Octal Pin Electronics with PMU; Planet ATE; Nov. 22, 2004.
Neptune, SOC Pin Electronics Companion PMU/DAC/Resistive Load; Planet ATE; Jun. 16, 2004.
Pluto, Octal PMU/VI with Ganging 5 MHz Pin Electronics; Planet ATE; Oct. 28, 2004.
Saturn, System on a Chip, Dual Channel Wide Voltage Pin Electronics Solution; Planet ATE; Jul. 19, 2005.
Venus, System on a Chip, Dual Channel 133 MHz Pin Electronics Solution; Planet ATE; Sep. 16, 2004.
Search Report in Application No. EP05854966, dated Mar. 4, 2008.
Search Report & Written Opinion in Application No. SG2007-03851-6, dated Dec. 26, 2007.
International Preliminary Report on Patentability in Application No. PCT/US2006/037413, dated Sep. 3, 2007.
International Search Report and Written Opinion in Application No. PCT/US06/037413, dated Feb. 19, 2007.
International Search Report & Written Opinion in Application No. PCT/US05/46332, dated Oct. 2, 2006.
International Preliminary Examination Report in Application No. PCT/US05/46332, dated Dec. 7, 2007.
International Search Report and Written Opinion in Application No. PCT/US06/07186, dated Mar. 17, 2008.
Thaler et al., "A Suite of Novel Digital ATE Timing Calibration Methods", Proc. Of the IEEE Int'l Test Conference on Discover the New World of Test and Design, (Sep. 20-24, 1992) IEEE Computer Soc., Washington, DC pp. 520-529.
Examination Report in EP Application No. 06804150.8, dated Oct. 6, 2008.

* cited by examiner

US 7,560,947 B2

PIN ELECTRONICS DRIVER

TECHNICAL FIELD

This patent application relates generally to circuitry for driving a pin of a device, such as a tester used in automatic test equipment (ATE).

BACKGROUND

Automatic test equipment (ATE) refers to an automated, usually computer-driven, system for testing devices, such as semiconductors, electronic circuits, and printed circuit board assemblies. A device tested by ATE is referred to as a device under test (DUT).

ATE typically includes a computer system and a testing device or a single device having corresponding functionality. Pin electronics are typically part of the testing device. Pin electronics includes drivers, comparators and/or active load functionality for testing a DUT. The drivers provide test signals to pins on the testing device.

ATE is capable of providing different types of signals to a DUT. Among these signals are test signals, which are used to test the DUT, and programming signals, which are used, e.g., to program an EPROM (Electrically Programmable Read-Only Memory) on the DUT. The test signals and programming signals, in particular, require paths having different impedance. More specifically, the programming signals are typically required to have a relatively high voltage. As such, it is best to drive the programming signals over a relatively low impedance path. This is done in order to prevent significant voltage drops and to ensure a relatively constant voltage in response to changes in load current. Testing signals are driven over an impedance path that is configured to match the impedance of the DUT and thereby reduce signal reflections from the DUT. The impedance path over which the test signals are driven has relatively high impedance, typically.

SUMMARY

This patent application describes methods and apparatus, including computer program products, for driving a pin of a device, such as a tester used in automatic test equipment (ATE).

In general, in one aspect, the invention is directed to circuitry for driving a pin of a device. The circuitry includes a first circuit path terminating in a first impedance, a second circuit path terminating in a second impedance, where the second impedance is less than the first impedance, and a selection circuit to control operation of the second circuit path. When the second circuit path is not configured for operation, the first circuit path is configured to output one of plural first voltage signals. When the second circuit path is in configured for operation, the second circuit path is configured to output a second voltage signal, where the second voltage signal is greater than the plural first voltage signals. This aspect may also include one or more of the following features.

The first circuit path may include an amplifier configured to generate an output voltage signal in response to an input voltage signal, where the output voltage signal comprises one of the plural voltage signals, and an impedance circuit to produce the first impedance. The second circuit path may include a current provider configured to output current, an amplifier configured to generate an output signal in response to an input voltage signal, and a first switch circuit that is between the amplifier and the current provider, where the first switch circuit is configured to close in response to a control signal. When the first switch circuit closes, the output current passes through the first switch circuit and through the second impedance to generate at least part of the second voltage signal. The first switch circuit may include a first transistor, and the second switch circuit may include a second transistor.

The current provider may include current limiting circuitry. The current limiting circuitry may be configured to limit the output current to a predefined maximum current. The current limiting circuitry may include a sense resistor included in the second impedance, circuit leads connected to different ends of the sense resistor for use in measuring a sense voltage across the sense resistor, and an amplifier configured to halt the output current when the sense voltage exceeds a predetermined value. The first impedance may be about 50Ω and the second impedance may be about 10Ω.

In general, in another aspect, the invention is directed to ATE comprising a computer system configured to provide control signals to a testing device, and a testing device configured to test a semiconductor device in accordance with the control signals. The testing device comprises a pin for providing voltage to the semiconductor device, and a driver configured to drive the voltage to the pin. The driver comprises a first driver circuit configured to provide a test signal to the semiconductor device via a first impedance path, and a second driver circuit configured to provide at least part of a programming signal to the semiconductor device via a second impedance path. The programming signal is of a higher voltage than the test signal, and the second impedance path has a lower impedance than the first impedance path. This aspect may also include one or more of the following features.

The first driver circuit may include an amplifier configured to generate the test signal in response to an input voltage signal, where the test signal comprises one of plural voltage signals, and an impedance circuit in the first impedance path. The second driver circuit may include a current provider configured to output current, an amplifier configured to generate an output signal in response to an input voltage signal, and a first switch circuit that is between the amplifier and the current provider. The first switch circuit is configured to close in response to the output signal. When the first switch circuit closes, the output current passes through the first switch circuit and through the second impedance path to generate at least part of the programming signal.

The ATE may also include a selection circuit configured to select at least one of the first driver circuit and the second driver circuit. When the first driver circuit is selected by the selection circuit, the second driver circuit remains enabled and the first driver circuit acts to reduce a source impedance of the test signal to the semiconductor device. The selection circuit may be configured to provide a control signal to the second driver circuit, where the control signal controls operation of the second driver circuit. The first switch circuit may include a first transistor to control the output signal to match an input signal of the amplifier. The current provider may include a current limiting circuit. The current limiting circuit is configured to limit the output current to a predefined maximum current. The current limiting circuit may include a sense resistor included in the second impedance, circuit leads connected to different ends of the sense resistor for use in measuring a sense voltage across the sense resistor, and an amplifier configured to halt the output current when the sense voltage exceeds a predetermined value. The first impedance path may have an impedance of about 50Ω and the second impedance path may have an impedance of about 10Ω.

In general, in another aspect, the invention is directed to an apparatus for driving signals to an output pin, which includes a first driver configured to provide test signals to the output pin via a first path having a first impedance, and a second driver configured to provide at least part of a programming signal to the device via a second path having a second impedance. The second impedance is less than the first impedance, and the programmed signal has a higher voltage than other signal levels. This aspect may also include one or more of the following features.

The second driver may include a current source configured to provide current, an amplifier configured to generate an output signal in response to an input signal, and a transistor controlled to set an output voltage level to match an input voltage to the amplifier. The transistor is driven to conduction in response to the output signal, thereby providing current from a collector to an emitter of the transistor. A resistor is connected to the emitter. The current passes through the resistor to the output pin. The apparatus may also include a shunt circuit configured to receive the output signal and thereby prevent at least part of the output signal from reaching the base of the transistor. The shunt circuit may be operable in response to a control signal to disable the second driver.

The details of one or more examples are set forth in the accompanying drawings and the description below. Further features, aspects, and advantages of the invention will become apparent from the description, the drawings, and the claims.

DESCRIPTION OF THE DRAWINGS

Like reference numerals in different figures indicate like elements.

DETAILED DESCRIPTION

Figure 1:
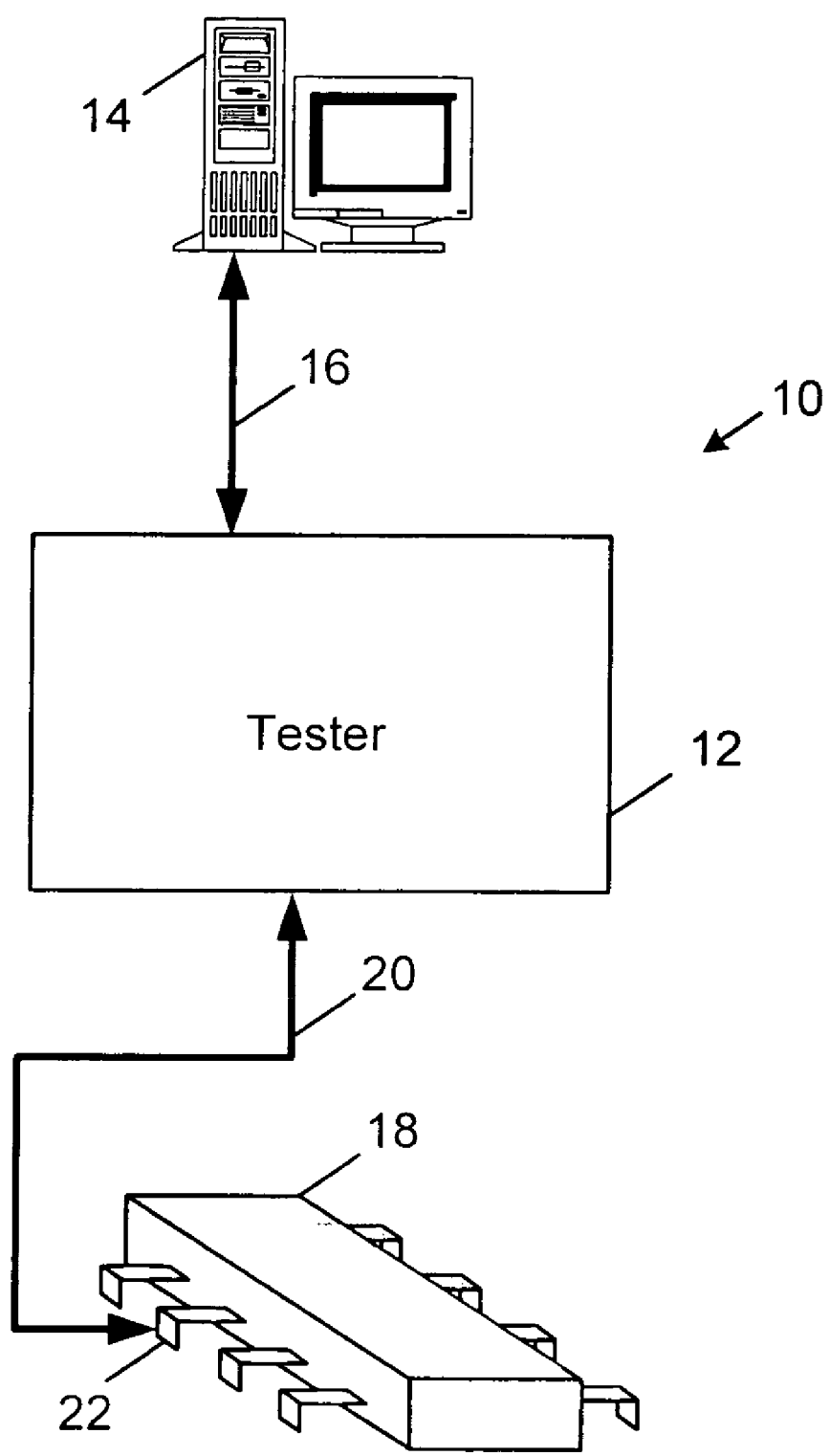
FIG. 1 is a block diagram of ATE for testing devices.

Referring to FIG. 1, a system 10 for testing a device-under-test (DUT) 18, such as semiconductor devices, includes a tester 12, such as automatic test equipment (ATE) or other similar testing device. To control tester 12, system 10 includes a computer system 14 that interfaces with tester 12 over a hardwire connection 16. Typically, computer system 14 sends commands to tester 12 that initiate the execution of routines and functions for testing DUT 18. Such executing test routines may initiate the generation and transmission of test signals to the DUT 18 and collecting responses from the DUT. Various types of DUTs may be tested by system 10. For example, DUTs may be semiconductor devices such as an integrated circuit (IC) chip (e.g., memory chip, microprocessor, analog-to-digital converter, digital-to-analog converter, etc.).

To provide test signals and collect responses from the DUT, tester 12 is connected to one or more connector pins that provide an interface for the internal circuitry of DUT 18. To test some DUTs, e.g., as many as sixty-four or one hundred twenty-eight connector pins (or more) may be interfaced to tester 12. For illustrative purposes, in this example semiconductor device tester 12 is connected to one connector pin of DUT 18 by a hardwire connection. A conductor 20 (e.g., cable) is connected to pin 22 and is used to deliver test signals (e.g., PMU test signals, PE test signals, etc.) to the internal circuitry of DUT 18. Conductor 20 also senses signals at pin 22 in response to the test signals provided by semiconductor device tester 12. For example, a voltage signal or a current signal may be sensed at pin 22 in response to a test signal and sent over conductor 20 to tester 12 for analysis. Such single port tests may also be performed on other pins included in DUT 18. For example, tester 12 may provide test signals into other pins and collect associated signals reflected back over conductors (that deliver the provided signals). By collecting the reflected signals, the input impedance of the pins may be characterized along with other single port testing quantities. In other test scenarios, a digital signal may be sent over conductor 20 to pin 22 for storing a digital value on DUT 18. Once stored, DUT 18 may be accessed to retrieve and send the stored digital value over conductor 20 to tester 12. The retrieved digital value may then be identified to determine if the proper value was stored on DUT 18.

Along with performing one-port measurements, a two-port test may also be performed by semiconductor device tester 12. For example, a test signal may be injected over conductor 20 into pin 22 and a response signal may be collected from one or more other pins of DUT 18. This response signal is provided to semiconductor device tester 12 to determine such quantities as gain response, phase response, and other throughput measurement quantities.

Figure 2:
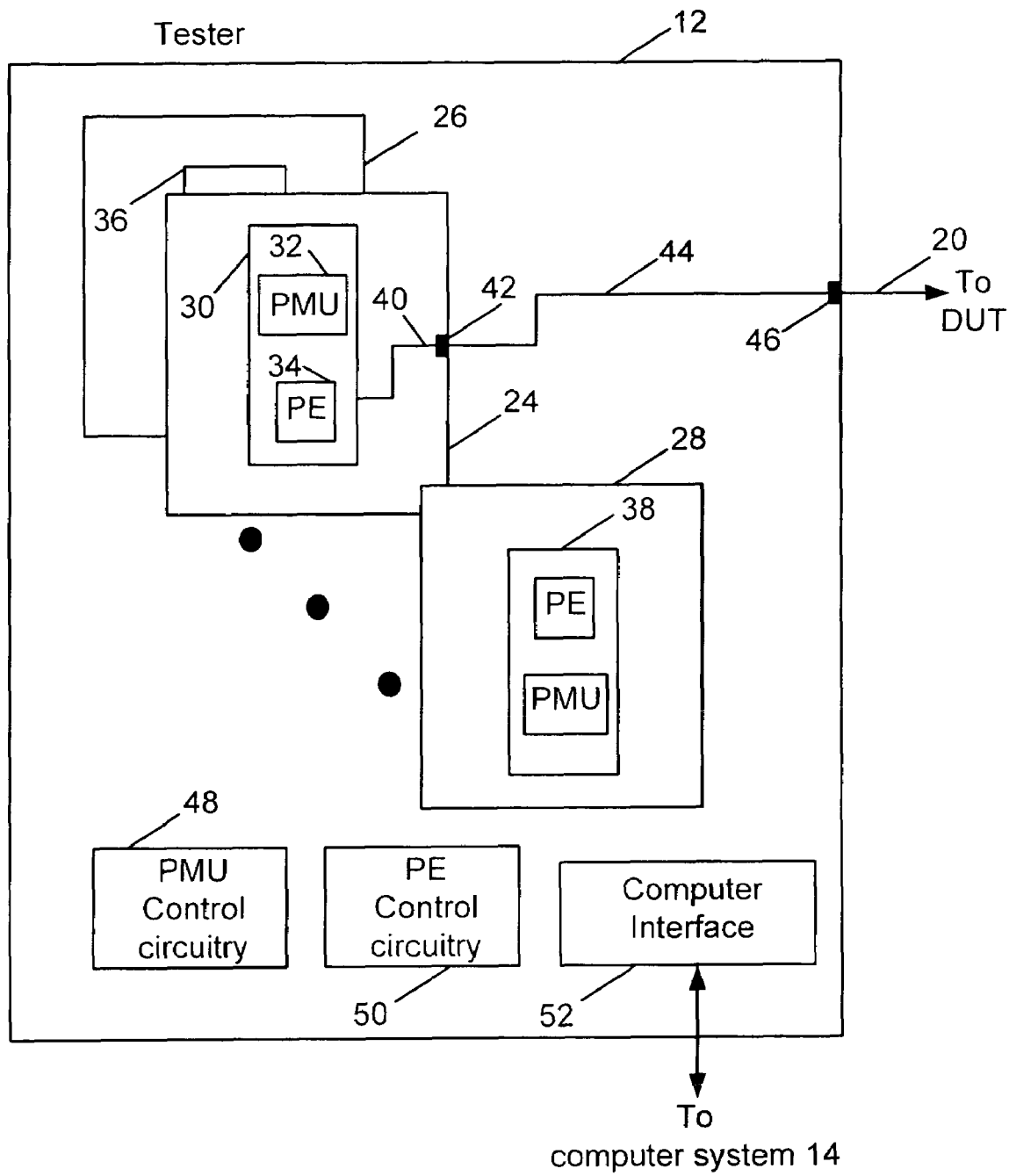
FIG. 2 is a block diagram of a tester used in the ATE of FIG. 1.

Referring also to FIG. 2, to send and collect test signals from multiple connector pins of a DUT (or multiple DUTs), semiconductor device tester 12 includes an interface card 24 that can communicate with numerous pins. For example, interface card 24 may transmit test signals to, e.g., 32, 64, or 128 pins and collect the corresponding responses. Each communication link to a pin is typically referred to as a channel and, by providing test signals to a large number of channels, testing time is reduced since multiple tests may be simultaneously performed. Along with having many channels on an interface card, by including multiple interface cards in tester 12, the overall number of channels increases, thereby further reducing testing time. In this example, two additional interface cards 26 and 28 are shown to demonstrate that multiple interface cards may populate tester 12.

Each interface card includes a dedicated integrated circuit (IC) chip (e.g., an application specific integrated circuit (ASIC)) for performing particular test functions. For example, interface card 24 includes IC chip 30 for performing parametric measurement unit (PMU) tests and pin electronics (PE) tests. IC chip 30 has a PMU stage 32 that includes circuitry for performing PMU tests and a PE stage 34 that includes circuitry for performing PE tests. Additionally, interface cards 26 and 28 respectively include IC chips 36 and 38 that include PMU and PE circuitry. Typically PMU testing involves providing a DC voltage or current signal to the DUT to determine such quantities as input and output impedance, current leakage, and other types of DC performance characterizations. PE testing involves sending AC test signals and waveforms to a DUT (e.g., DUT 18) and collecting responses to further characterize the performance of the DUT. For example, IC chip 30 may transmit (to the DUT) AC test signals that represent a vector of binary values for storing on the DUT. Once these binary values have been stored, the DUT is accessed by tester 12 to determine if the correct binary values have been stored. Since digital signals typically include abrupt voltage transitions, the circuitry in PE stage 34 on IC chip 30 operates at a relatively high speed in comparison to the circuitry in PMU stage 32.

To pass both DC and AC test signals and waveforms from interface card 24 to DUT 18, a conducting trace 40 connects IC chip 30 to an interface board connector 42 that allows signals to be passed on and off interface board 24. Interface board connector 42 is also connected to a conductor 44 that is connected to an interface connector 46, which allows signals to be passed to and from tester 12. In this example conductor 20 is connected to interface connector 46 for bi-directional signal passing between tester 12 and pin 22 of DUT 18. In some arrangements, an interface device may be used to connect one or more conductors from tester 12 to the DUT. For example, the DUT (e.g., DUT 18) may be mounted onto a device interface board (DIB) for providing access to each DUT pin. In such an arrangement, conductor 20 may be connected to the DIB for placing test signals on the appropriate pin(s) (e.g., pin 22) of the DUT.

In this example only conducting trace 40 and conductor 44 respectively connect IC chip 30 and interface board 24 for delivering and collecting signals. However, IC chip 30 (along with IC chips 36 and 38) typically has multiple pins (e.g., eight, sixteen, etc.) that are respectively connected with multiple conducting traces and corresponding conductors for providing and collecting signals from the DUT (via a DIB). Additionally, in some arrangements, tester 12 may connect to two or more DIB's for interfacing the channels provided by interface cards 24, 26, and 28 to one or multiple devices under test.

To initiate and control the testing performed by interface cards 24, 26, and 28, tester 12 includes PMU control circuitry 48 and PE control circuitry 50 that provide test parameters (e.g., test signal voltage level, test signal current level, digital values, etc.) for producing test signals and analyzing DUT responses. Tester 12 also includes a computer interface 52 that allows computer system 14 to control the operations executed by tester 12 and also allows data (e.g., test parameters, DUT responses, etc.) passing between tester 12 and computer system 14.

Figure 3:
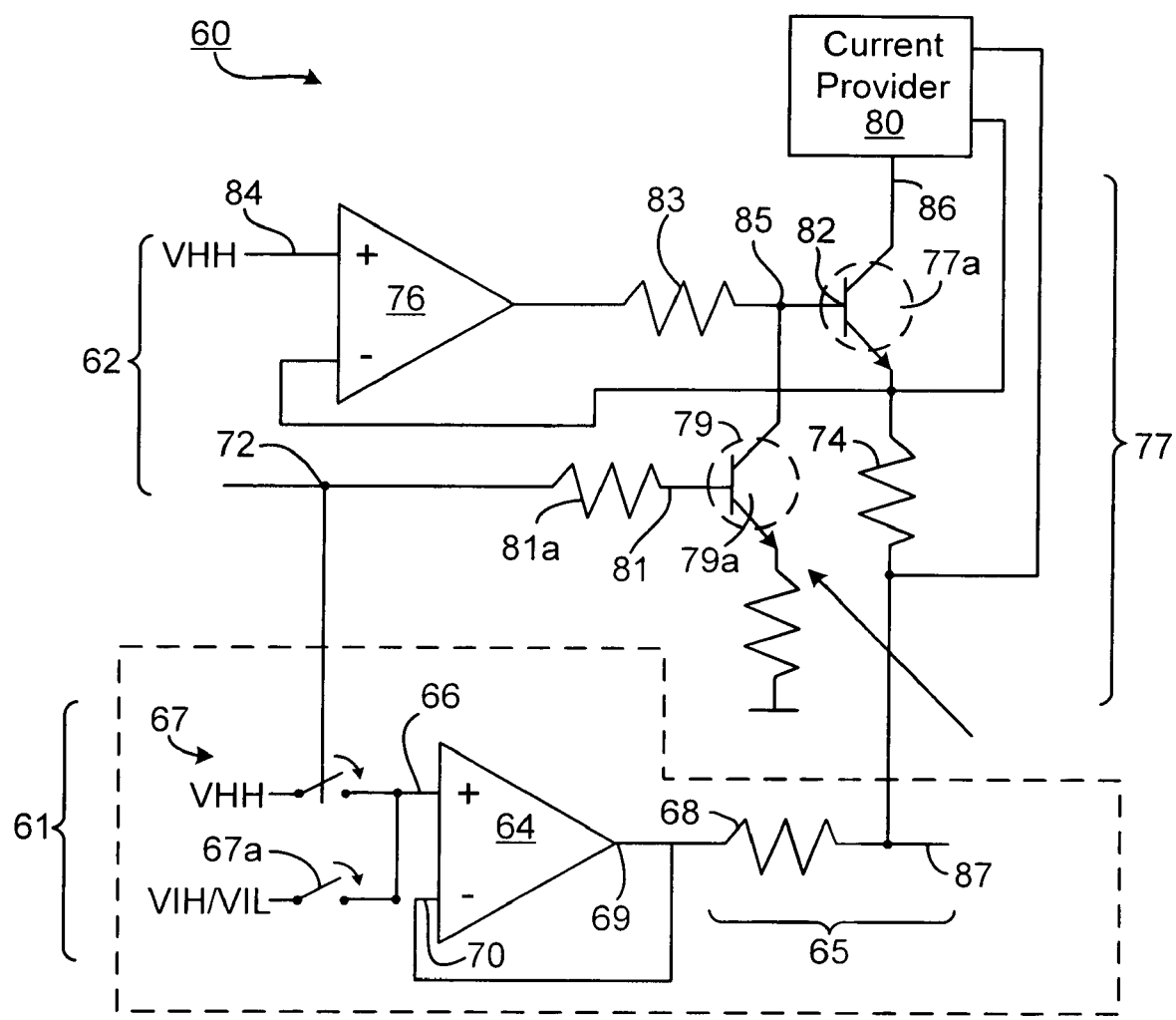
FIG. 3 is a diagram of circuitry in the tester for driving an output voltage.

FIG. 3 is a circuit diagram showing driver circuitry 60 for driving signals to a pin of tester 12. The driver circuitry may be part of one of more of the interface cards 24, 26, and 28 described above. Driver circuitry 60 includes a first driver 61 and a second driver 62. In this example, first driver 61 is used to drive test signals to the pin. The test signals may be passed to the DUT and, in response, the DUT may provide signals back to tester 12, which are later evaluated to determine whether the DUT is working properly.

First driver 61 includes an operational amplifier (op-amp) 64 and an impedance circuit 65. First driver 61 is not limited to use with an op-amp, but rather may include any circuitry capable of providing an appropriate voltage. Here, impedance circuit 65 is a resistor, but may be any type of circuitry that is capable of producing an impedance. For example, impedance circuit 65 may be a network of resistors, transistors, and/or other circuitry. Impedance circuit 65 has relatively high impedance.

In this case, impedance circuit 65 includes a resistor 68 having a resistance of about 46Ω. In this example, the target termination impedance for the circuit path defined by first driver 61 is about 50Ω. The remaining 4Ω comes from impedance inherent in the circuit path. It is noted that first driver 61 is not limited to use with a 50Ω circuit path. The impedance of the circuit path may be adjusted to match that of a DUT in tester 12.

The drivers are configured to allow the programming of three levels, $V_{IH}$, $V_{IL}$ and $V_{HH}$. Other types of signals may be driven instead of, or in addition to, high and low signals. In operation, $V_{HH}$, $V_{IH}$ or $V_{IL}$ is provided to the positive input 66 of op-amp 64. A selection circuit 67 selects either the $V_{IH}/V_{IL}$ input or the $V_{HH}$ input (described below). Selection circuit 67 is depicted in FIG. 3 as switches. Transistors may be used to implement these switches, e.g., by driving the transistor bases to conduction thereby allowing signals to pass. Other circuit elements in addition to, or instead of, transistors may be used to implement selection circuit 67.

To drive $V_{IH}$ or $V_{IL}$ to the pin, first driver 61 operates as follows. $V_{IH}$ or $V_{IL}$ is provided from an external source (not shown) to selection circuit 67. In response, selection circuit 67 closes switch 67a, thereby allowing $V_{IH}$ or $V_{IL}$ to pass to the positive input 66 of op-amp 64. The feedback path from the output 69 of op-amp 64 to its negative input 70 causes the output signal of op-amp 64 to stabilize at either $V_{IH}$ (if $V_{IH}$ was input) or $V_{IL}$ (if $V_{IL}$ was input). This signal passes through impedance circuit 65 to the corresponding output pin (not shown) of tester 12.

The programming voltage $V_{HH}$ is higher than $V_{IH}$ or $V_{IL}$, and may be used, e.g., to program an EPROM or other device on the DUT via the pin. Since a relatively high voltage is needed for programming, the termination impedance should be relatively low (in order not to induce large voltage drops during signal output). Accordingly, second driver 62 is configured to provide relatively low termination impedance. In this example, the termination impedance is about 10Ω. This 10Ω includes 5Ω provided by resistor 74 and the remaining 5Ω from impedance inherent in circuit path 75. It is noted that second driver 62 is not limited to use with a 10Ω termination impedance. Any appropriate termination impedance may be used. Also, additional circuitry, such as one or more capacitors, may be included to generate the termination impedance.

If $V_{HH}$ is selected, both drivers, 61 and 62, are active. Driver 61 turns on first, forcing $V_{HH}$ on the pin through a 50Ω source impedance in this implementation. The low impedance (5Ω in this implementation) driver turns on whenever the $V_{HH}$ level is being driven from the 50Ω driver. However, the 5Ω driver is designed to have a somewhat slower turn-on time than the 50Ω driver. It is designed to be fairly quickly turned off when a $V_{IH}$ or $V_{IL}$ level is requested. This can be managed by controlling the values of the base resistor 83 in $V_{HH}$ drive transistor 82 and the base resistor 81a for the pulldown transistor 79 that helps turn off the low impedance driver. In some cases it may be necessary to add some small capacitances to make the timing work correctly.

Second driver 62 includes an op-amp 76, a first switch circuit 77, a second switch circuit 79, and a current provider circuit 80. In this embodiment, first switch circuit 77 and second switch circuit 79 are transistors; however, other circuitry may be used to implement the first and second switch circuits instead of, or in addition to, transistors. Second switch circuit 79 acts as a shunt circuit to draw the output of op-amp 76 to ground and thereby disable second driver 62. As noted above, when first driver 61 is configured to drive $V_{IH}$ or $V_{IL}$ signals to the output pin, second driver is disabled. Second driver 62 is disabled by connecting input 72 to a high level signal. This high level signal is applied to the base 81 of transistor 79a, which drives transistor 79a to conduction. As a result, the output current of op-amp 76, or a significant portion thereof, is drawn to ground through transistor 79a. Switch circuit 77 is therefore not activated. That is, not enough current is applied to the base 82 of transistor 77a to drive transistor 77a to conduction. This prevents a controlled voltage output via circuit path 75.

When second driver 62 is enabled, a low level signal is applied to the base 81 of transistor 79a, thereby preventing transistor 79a from conducting. As a result, the output of op-amp 76 (a current signal) is provided to first switch circuit 77, in this example, to the base 82 of transistor 77a. The output is a function of an input $V_{HH}$ voltage applied to the positive input 84 of the op-amp, and a feedback signal from node 85. When the output of op-amp 76 is applied to the base of transistor 82, transistor 77a is driven to conduction. As shown in FIG. 3, source 86 of transistor 77a is connected to a current provider circuit 80. Current provider circuit 80 may include, e.g., an operational amplifier and/or other circuit elements. When transistor 77a is driven to conduction, current from current provider circuit 80 passes through the source-drain path of transistor 77a and through impedance circuit 74. This results in an output voltage at pin 87. When appropriate current is provided, the output voltage is about $V_{HH}$.

Current provider circuit 80 is also configured to limit the output current in order to prevent the DUT from drawing too much current and thereby damaging driver circuitry 60. In this example, the current limiting circuitry measures the voltage across resistor 74 and, if the voltage exceeds a predefined maximum, halts current output from current provider circuit 80. An op-amp in current provider circuit 80 may be configured to prevent current output if its input voltage (e.g., the voltage across resistor 74) is greater than the predefined maximum.

The ATE can be implemented, at least in part, via a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps associated with implementing the ATE can be performed by one or more programmable processors executing one or more computer programs to perform the functions of the ATE. All or part of the ATE can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer include a processor for executing instructions and one or more memory devices for storing instructions and data.

The circuitry is not limited to the specific examples described herein. For example, while this disclosure describes circuitry within automatic test equipment, the circuitry described herein may be used in any circuit environment requiring high voltage pins providing voltages higher than provided by a pin electronics driver.

Elements of different embodiments described herein may be combined to form other embodiments not specifically set forth above. Other embodiments not specifically described herein are also within the scope of the following claims.

What is claimed is:

1. Automatic test equipment (ATE) comprising:
   a computer system configured to provide control signals to a testing device; and
   a testing device configured to test a semiconductor device in accordance with the control signals, the testing device comprising a pin for providing voltage to the semiconductor device, the testing device comprising a driver configured to drive the voltage to the pin, wherein the driver comprises:
   a first driver circuit configured to provide at least part of a programming signal to the semiconductor device via a first impedance path; and
   a second driver circuit configured to provide at least part of the programming signal to the semiconductor device via a second impedance path, the programming signal for programming the semiconductor device, the programming signal having a higher voltage level than a test signal provided to test the semiconductor device, and the second impedance path having a lower impedance than the first impedance path;
   wherein the second driver circuit is configured to activate when the first driver circuit provides at least part of the programming signal, and
   wherein the second driver circuit has a slower turn-on time than the first driver circuit.

2. The ATE of claim 1, wherein the first driver circuit comprises:
   an amplifier configured to generate the test signal in response to an input voltage signal, the test signal comprising one of plural voltage signals; and
   an impedance circuit in the first impedance path.

3. The ATE of claim 1, wherein the second driver circuit comprises:
   a current provider configured to output current;
   an amplifier configured to generate an output signal in response to an input voltage signal;
   a first switch circuit that is between the amplifier and the current provider, the first switch circuit being configured to close in response to the output signal;
   wherein, when the first switch circuit closes, the output current passes through the first switch circuit and through the second impedance path to generate at least part of the programming signal.

4. The ATE of claim 3, further comprising:
   a selection circuit configured to select at least one of the first driver circuit and the second driver circuit;
   wherein, when the second driver circuit is selected by the selection circuit, the first driver circuit remains enabled.

5. The ATE of claim 4, wherein the selection circuit is configured to provide a control signal to the second driver circuit, the control signal controlling operation of the second driver circuit.

6. The ATE of claim 3, wherein the first switch circuit comprises a first transistor.

7. The ATE of claim 3, wherein the current provider comprises a current limiting circuit, the current limiting circuit being configured to limit the output current to a predefined maximum current.

8. The ATE of claim 7, wherein the current limiting circuit comprises:
   a sense resistor included in the second impedance;
   circuit leads connected to different ends of the sense resistor for use in measuring a sense voltage across the sense resistor; and
   an amplifier configured to halt the output current when the sense voltage exceeds a predetermined level.

9. The ATE of claim 1, wherein the first impedance path has an impedance of 50Ω and the second impedance path has an impedance of 10Ω.

10. An apparatus for driving signals to an output pin, the apparatus comprising: a testing device configured to test a semiconductor device, the testing device comprising a driver, wherein the driver comprises: a first driver circuit configured to provide at least part of a programming signal to the output pin via a first path having a first impedance; and a second driver circuit configured to provide at least part of the programming signal to the output pin via a second path having a second impedance, the programming signal for programming the semiconductor device, the second impedance being less than the first impedance, and the programming signal having a higher voltage level than other signal levels provided by the apparatus to the output pin; wherein the second driver circuit is configured to activate when the first driver circuit provides at least part of the programming signal, and wherein the second driver circuit has a slower turn-on time than the first driver circuit.

11. The apparatus of claim 10, wherein the second driver circuit comprises: a current source configured to provide current; an amplifier configured to generate an output signal in response to an input signal; a transistor configured to be driven to conduction in response to the output signal, thereby providing current from a collector to an emitter of the transistor; and a resistor connected to the emitter, the current passing through the resistor to the output pin.

12. The apparatus of claim 11, further comprising a shunt circuit configured to receive the output signal and thereby prevent at least part of the output signal from reaching the base of the transistor, the shunt circuit being operable in response to a control signal to disable the second driver circuit.

13. The apparatus of claim 11, wherein the first impedance is 50Ω and the second impedance path is 10Ω.

14. The apparatus of claim 11, further comprising a current limiting circuit, the current limiting circuit being configured to limit the current to a predefined maximum current.

15. The apparatus of claim 14, wherein the current limiting circuit comprises:
a sense resistor included in the second impedance;
circuit leads connected to different ends of the sense resistor for use in measuring a sense voltage across the sense resistor; and
an amplifier configured to halt the current when the sense voltage exceeds a predetermined level.

16. The apparatus of claim 10, wherein the first driver circuit comprises: an amplifier configured to generate a test signal in response to an input voltage signal, the test signal comprising one of plural voltage signals; and an impedance circuit in the first impedance path.

17. The apparatus of claim 10, further comprising: a selection circuit configured to select at least one of the first driver circuit and the second driver circuit; wherein, when the second driver circuit is selected by the selection circuit, the first driver circuit remains enabled.

18. The apparatus of claim 17, wherein the selection circuit is configured to provide a control signal to the second driver circuit, the control signal for controlling operation of the second driver circuit.

19. The ATE of claim 11, further comprising a shunt circuit configured to prevent at least part of the output signal from reaching the base of the transistor, the shunt circuit being operable in response to a control signal to disable the second driver circuit.

20. An apparatus for driving signals to a device, the apparatus comprising: a testing device configured to test a semiconductor device, the testing device comprising a driver, wherein the driver comprises: a first driver circuit configured to provide at least part of a programming signal to the device via a first path having a first impedance; and a second driver circuit configured to provide at least part of the programming signal to the device via a second path having a second impedance, the second impedance being less than the first impedance, and the programming signal having a higher voltage level than other signal levels provided by the apparatus to the device; wherein the second driver circuit is configured to activate when the first driver circuit provides at least part of the programming signal, and wherein the second driver circuit has a slower turn-on time than the first driver circuit; and wherein the second driver circuit comprises: a current source to provide current through the second impedance to regulate a voltage level of the programming signal; and circuitry to limit an amount of the current drawn by the device.

21. The apparatus of claim 20, wherein the circuitry comprises:
a circuit element between the current source and the device; and
a feedback path electrically connected between the circuit element and the device, the feedback path being electrically connected to the current source;
wherein the current source regulates the current in accordance with a signal provided via the feedback path.

22. The apparatus of claim 21, wherein the circuit element comprises a resistor and the signal corresponds to a voltage across the resistor.

23. The apparatus of claim 21, wherein the second driver circuit further comprises: an amplifier configured to generate an output signal in response to an input signal; and a transistor configured to be driven to conduction in response to the output signal, thereby providing current from the current source from a collector to an emitter of the transistor.

24. The apparatus of claim 23, further comprising a shunt circuit configured to prevent at least part of the output signal from reaching the base of the transistor, the shunt circuit being operable in response to a control signal to disable the second driver circuit.

25. An apparatus for driving signals to an output pin of a semiconductor device, the apparatus comprising:
a first driver configured to provide test signals to the output pin via a first path having a first impedance, the test signals for testing the semiconductor device;
a second driver configured to provide at least part of a programming signal to the semiconductor device via a second path having a second impedance, the programming signal for programming the semiconductor device, the second impedance being less than the first impedance, and the programming signal having a higher voltage level than other signal levels;
wherein the second driver comprises:
a current source configured to provide current;
an amplifier configured to generate an output signal in response to an input signal;
a transistor configured to be driven to conduction in response to the output signal,
thereby providing current from a collector to an emitter of the transistor; and
a resistor connected to the emitter, the current passing through the resistor to the output pin.

26. The apparatus of claim 25, further comprising a shunt circuit configured to receive the output signal and thereby prevent at least part of the output signal from reaching the base of the transistor, the shunt circuit being operable in response to a control signal to disable the second driver.

27. The apparatus of claim 25, wherein the first impedance is 50Ω and the second impedance path is 10Ω.

28. An apparatus for driving signals to an output pin of a device, the apparatus comprising:
a first driver configured to provide test signals to the output pin via a first path having a first impedance; and
a second driver configured to provide at least part of a programming signal to the output pin via a second path having a second impedance, the second impedance being less than the first impedance, and the programming signal having a higher voltage level than other signal levels;
wherein the second driver comprises:
  a current source to provide current through the second impedance to regulate a voltage level of the programming signal; and
  circuitry to limit an amount of the current drawn through the output pin, wherein the circuitry comprises:
    a circuit element between the current source and the output pin; and
    a feedback path electrically connected between the circuit element and the output pin, the feedback path being electrically connected to the current source;
    wherein the current source regulates the current in accordance with a signal provided via the feedback path.

29. The apparatus of claim 28, wherein the circuit element comprises a resistor and the signal corresponds to a voltage across the resistor.

30. The apparatus of claim 28, wherein the second driver further comprises:
  an amplifier configured to generate an output signal in response to an input signal; and
  a transistor configured to be driven to conduction in response to the output signal, thereby providing current from the current source from a collector to an emitter of the transistor.

31. The apparatus of claim 30, further comprising a shunt circuit configured to prevent at least part of the output signal from reaching the base of the transistor, the shunt circuit being operable in response to a control signal to disable the second driver.

* * * * *

UNITED STATES PATENT AND TRADEMARK OFFICE
CERTIFICATE OF CORRECTION

| | | |
|---|---|---|
| PATENT NO. | : 7,560,947 B2 | |
| APPLICATION NO. | : 11/237384 | |
| DATED | : July 14, 2009 | |
| INVENTOR(S) | : Ronald A. Sartschev | |

It is certified that error appears in the above-identified patent and that said Letters Patent is hereby corrected as shown below:

On the Title Pg Item (57) (abstract), Line 8:
delete "is in" and insert -- is --, therefor.

Column 9, Line 52, Claim 19:
delete "ATE" and insert -- apparatus --, therefor.

Signed and Sealed this
Twenty-eighth Day of February, 2012

David J. Kappos
*Director of the United States Patent and Trademark Office*